United States Patent [19]

Takai et al.

[11] Patent Number: 5,095,230
[45] Date of Patent: Mar. 10, 1992

[54] DATA OUTPUT CIRCUIT OF SEMICONDUCTOR DEVICE

[75] Inventors: Yasuhiro Takai; Yukio Fukuzo, both of Tokyo, Japan

[73] Assignee: NEC Corporation, Tokyo, Japan

[21] Appl. No.: 706,146

[22] Filed: May 28, 1991

[30] Foreign Application Priority Data

May 28, 1990 [JP] Japan .................................. 2-137372

[51] Int. Cl.$^5$ ........................................... H03K 17/16
[52] U.S. Cl. .................................. 307/451; 307/445; 307/448; 307/443
[58] Field of Search ................. 307/445, 451, 448, 443

[56] References Cited

U.S. PATENT DOCUMENTS 4,779,013 10/1988 Tanaka .................................. 307/451
4,829,199 5/1989 Prater .................................. 307/445

Primary Examiner—Stanley D. Miller
Assistant Examiner—Scott A. Ouellette
Attorney, Agent, or Firm—Sughrue, Mion, Zinn, Macpeak & Seas

[57] ABSTRACT

A data output circuit with a first and a second input node and an output node has a two-input NAND gate connected to the two input nodes, a two-input NOR gate connected to the two input nodes and a first to a fourth field effect transistor. The first and second transistors are connected in parallel between a power source line and the output node with the gate of the first transistor being connected to an output of the NAND gate and with the gate of the second transistor being connected to the first input node. The third and fourth transistors are connected in parallel between the output node and the ground line with the gate of the third transistor being connected to an output of the NOR gate and with the gate of the fourth transistor being connected to the first input node. The first and second transistors are P-channel MOS transistors and the second and third transistors are N-channel MOS transistors. The data output circuit can produce outputs of four different levels based on combinations of levels of signals applied to the two input nodes.

2 Claims, 1 Drawing Sheet

DATA OUTPUT CIRCUIT OF SEMICONDUCTOR DEVICE

BACKGROUND OF THE INVENTION

The present invention relates to a semiconductor device and, more particularly, to a data output circuit of the semiconductor device.

In a conventional semiconductor device of the kind to which the present invention relates, an inverter is utilized as a data output circuit.

A typical example of such a conventional data output circuit is shown in FIG. 1. In the figure, IN is a data input node, OUT is a data output node, $Q_P$ is a P-channel MOS field effect transistor (hereinafter referred to as "FET"), $Q_N$ is an N-channel MOSFET, $V_{CC}$ is a power source line, and GND is ground line. In such a data output circuit, the P-channel MOSFET $Q_P$ turns OFF and the N-channel MOSFET $Q_N$ turns ON when the potential of the data input node IN becomes a high level (hereinafter referred to as "H") and, upon the data output node OUT being grounded through the N-channel MOSFET $Q_N$, this output node OUT turns to the ground level, that is, 0 V. On the other hand, when the potential of the data input node IN becomes a low level (hereinafter referred to as "L"), the P-channel MOSFET $Q_P$ turns ON and the N-channel MOSFET $Q_N$ turns OFF and, upon the data output node OUT being connected to the power source line $V_{CC}$ through the P-channel MOSFET $Q_P$, the output node OUT turns to the level of the power source level (hereinafter referred to as "$V_{CC}$ level"). Thus, in such conventional data output circuit, the inverter which is constituted by the P-channel MOSFET and the N-channel MOSFET outputs 0 V level and $V_{CC}$ level with respect to one bit input.

In the conventional semiconductor device as explained above, it is necessary to provide one output node (that is, one output wiring) for every one-bit input so that, in order to be able to transfer a number of data internally in a chip, an area for the output wirings in the chip has to be inevitably large, which is a disadvantage in achieving a high integration of the semiconductor integrated circuit device.

SUMMARY OF THE INVENTION

It is, therefore, an object of the invention to overcome the problems existing in the conventional output circuits and to provide an improved data output circuit of the semiconductor device.

It is another object of the invention to provide a data output circuit in which the necessary area for output wirings can be substantially reduced and which is suitable for the semiconductor device to have a high integration density.

According to one aspect of the invention, there is provided a data output circuit of a semiconductor device which circuit comprises:

a two-input NAND gate having its input terminals respectively connected to a first input node and a second input node;

a two-input NOR gate having its input terminals respectively connected to the first input node and the second input node;

a first P-channel MOS field effect transistor connected between a power source line and an output node and having its gate connected to an output terminal of the two-input NAND gate;

a second N-channel MOS field effect transistor connected between the power source line and the output node in parallel with respect to the first transistor and having its gate connected to the first input node;

a third N-channel MOS field effect transistor connected between the ground and the output node and having its gate connected to an output terminal of the two-input NOR gate; and a fourth P-channel MOS field effect transistor connected between the ground and the output node in parallel with respect to the third transistor and having its gate connected to the first input node.

A feature or an advantage achieved by the present invention is that since, based on the combination of the levels of the two input signals, there are produced outputs of four levels which are outputted through one output line and which consist of a power source level, a ground level, a level lower than the power source level by the threshold voltage of the N-channel MOSFET and a level higher than the ground level by the absolute value of the threshold voltage of the P-channel MOSFET, it is possible to make a substantial reduction in a wiring area and to realize a higher integration of the semiconductor device.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

The present invention is hereinafter explained with reference to the appended drawings.

Figure 1:
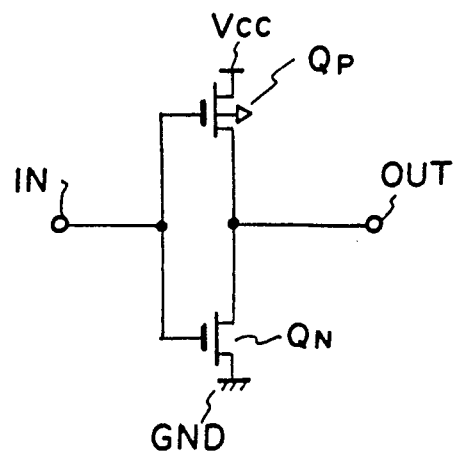
FIG. 1 shows a conventional data output circuit of the semiconductor circuit device.
Figure 2:
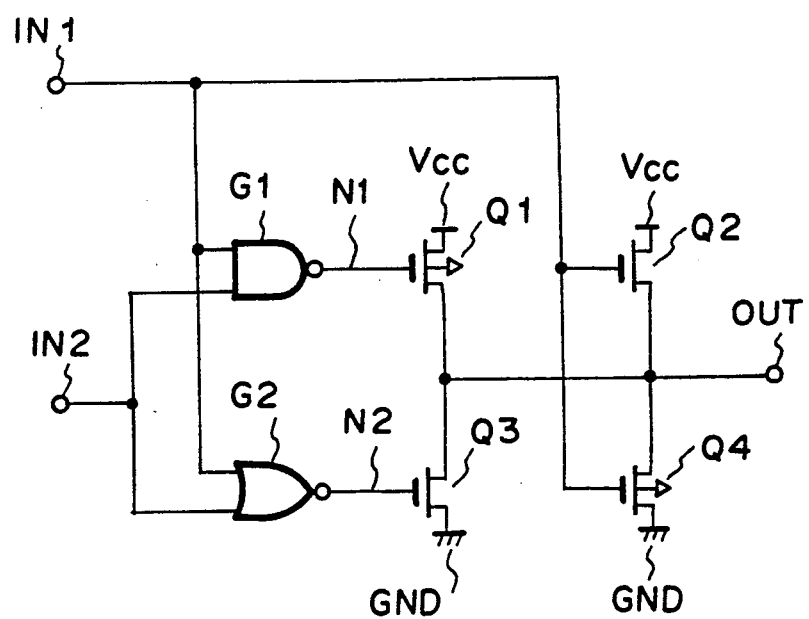
FIG. 2 shows a data output circuit according to the present invention.

FIG. 2 shows in a circuit diagram a configuration of a data output circuit according to the present invention. The data output circuit of this embodiment includes a two-input NAND gate G1 whose input terminals are connected to a first input node IN1 and a second input node IN2; a two-input NOR gate G2 whose input terminals are connected to the first input node IN1 and the second input node IN2; a first P-channel MOSFET Q1 connected between the power source line $V_{CC}$ and the output node OUT and having its gate connected to an output terminal of the two-input NAND gate G1; a second N-channel MOSFET Q2 connected between the power source line $V_{CC}$ and the output node OUT in parallel with respect to the first P-channel MOSFET Q1 and having its gate connected to the first input node IN1; a third N-channel MOSFET Q3 connected between the ground GND and the output node OUT and having its gate connected to an output terminal of the two-input NOR gate G2; and a fourth P-channel MOSFET Q4 connected between the ground GND and the output node OUT in parallel with the third N-channel MOSFET Q3 and having its gate connected to the first input node IN1.

The above data output circuit of the invention operates such that outputs of the four levels with respect to two input signals can be outputted from one output line.

The operation of such data output circuit is hereinafter explained in detail in four different combinations of the input signals.

First, the operation which takes place when the input node IN1 is at "H" and the input node IN2 is at "L" is explained. Under this state, the output N1 of the NAND gate G1 which receives inputs from the first input node IN1 and the second input node IN2 becomes "H", so that the P-channel MOSFET Q1 turns to its OFF state. Further, since the output N2 of the NOR gate G2 which receives inputs from the first input node IN1 and the second input node IN2 becomes "L", so that the P-channel MOSFET Q3 turns to its "OFF" state. On the other hand, the P-channel MOSFET Q4 whose gate receives an input from the first input node IN1 turns to its OFF state so that the N-channel MOSFET Q2 turns to its ON state. That is to say that only the MOSFET Q2 turns to its ON state and, since the drain and the gate of the MOSFET Q2 are of ground level, the output node OUT which is the source of the MOSFET Q2 turns to a level which is lower than the power source level $V_{CC}$ by the amount of the threshold voltage $V_{T(Q2)}$ of the N-channel MOSFET Q2.

Next, when the first input node IN1 is at "H" and the second input node IN2 is also at "H", the outputs N1, N2 becomes "L" so that the MOSFETs Q3, Q4 turn OFF and the MOSFET Q1 turns ON. Since the gate of the P-channel MOSFET Q1 is of the ground level and the source thereof is at the power source level $V_{CC}$, the output node OUT which is the drain of the P-channel MOSFET Q1 is rendered to be the power source level $V_{CC}$. Since all of the gate, the source and the drain of the N-channel MOSFET Q2 are of the power supply source level $V_{CC}$, this MOSFET Q2 is constantly in its OFF state. That is, between the potential of the output of the output node OUT and the potential which is lower than the power source level $V_{CC}$ by the amount of the threshold voltage $V_{T(Q2)}$ of the N-channel MOSFET Q2, if the former is lower than the latter, the MOSFETs Q1 and Q2 both turn on thereby supplying the charge to the output node OUT and, if the former is higher than the latter, the MOSFET Q2 turns OFF and the output node OUT is caused to reach the power source level $V_{CC}$ only by the MOSFET Q1.

Further, when the input node IN1 is at "L" and the input node IN2 is also at "L", both the nodes N1 and N2 turn to "H" and, since only the MOSFET Q3 is ON, the output node OUT turns to the ground level GND.

Lastly, when the input node IN1 is at "L" and the input node IN2 is at "H", only the MOSFET Q4 turns ON so that the output node OUT turns to a level higher than the ground level GND by the amount of absolute value of the threshold voltage $V_{T(Q4)}$ of the P-channel MOSFET Q4.

Following table shows the relations between the input levels applied to the input nodes IN1, IN2 and the output levels appearing at the output node OUT in the respective cases explained above.

TABLE

| IN1 | IN2 | OUT |
|---|---|---|
| H | L | $V_{CC} - V_{T(Q2)}$ |
| H | H | $V_{CC}$ |
| L | L | GND |
| L | H | $GND + |V_{T(Q4)}|$ |

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A data output circuit having a first and second input nodes and an output node of semiconductor device, the circuit comprising:
   a two-input NAND gate having its input terminals respectively connected to said first input node and said second input node;
   a two-input NOR gate having its input terminals respectively connected to said first input node and said second input node;
   a first MOS field effect transistor of a first conductivity type connected between a power source line and said output node and having its gate connected to an output line of said two-input NAND gate;
   a second MOS field effect transistor of a second conductivity type connected between said power source line and the output node in parallel with respect to said first transistor and having its gate connected to said first input node;
   a third MOS field effect transistor of said second conductivity type connected between the ground and said output node and having its gate connected to an output line of said two-input NOR gate; and
   a fourth MOS field effect transistor of said first conductivity type connected between the ground and said output node in parallel with respect to said third transistor and having its gate connected to said first input node.

2. A data output circuit according to claim 1, in which said first conductivity type of said first and fourth transistors is of P-channel and said second conductivity type of said second and third transistors is of an N-channel.

* * * * *